United States Patent
Hurt et al.

(10) Patent No.: US 6,763,492 B1
(45) Date of Patent: Jul. 13, 2004

(54) METHOD AND APPARATUS FOR ENCODING OF LINEAR BLOCK CODES

(75) Inventors: James Y. Hurt, San Diego, CA (US); Jeffrey A. Levin, San Diego, CA (US); Nikolai Schlegel, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 342 days.

(21) Appl. No.: 09/671,372

(22) Filed: Sep. 26, 2000

(51) Int. Cl.$^7$ .................................................. H03M 13/00
(52) U.S. Cl. ........................................ 714/752; 714/746
(58) Field of Search .............................. 714/759, 752, 714/779, 758, 751, 800, 746, 699

(56) References Cited

U.S. PATENT DOCUMENTS

| | | | | |
|---|---|---|---|---|
| 5,303,245 A | * | 4/1994 | Shikakura et al. | 714/781 |
| 5,491,700 A | * | 2/1996 | Wright et al. | 714/759 |
| 5,703,887 A | * | 12/1997 | Heegard et al. | 714/775 |
| 5,978,956 A | * | 11/1999 | Weng et al. | 714/784 |
| 6,029,186 A | | 2/2000 | DesJardins et al. | |
| 6,105,158 A | * | 8/2000 | Chen et al. | 714/755 |
| 6,195,780 B1 | * | 2/2001 | Dravida et al. | 714/758 |
| 6,263,470 B1 | * | 7/2001 | Hung et al. | 714/784 |
| 6,308,295 B1 | * | 10/2001 | Sridharan et al. | 714/755 |
| 6,336,200 B1 | * | 1/2002 | Wolfgang | 714/752 |
| 6,360,348 B1 | * | 3/2002 | Yang | 714/784 |

FOREIGN PATENT DOCUMENTS

| | | |
|---|---|---|
| EP | 0470451 A2 | 2/1992 |
| EP | 0609595 A1 | 8/1994 |
| WO | 94/15407 | 7/1994 |

\* cited by examiner

*Primary Examiner*—Albert Decady
*Assistant Examiner*—Mujtaba Chaudry
(74) *Attorney, Agent, or Firm*—Philip Wadsworth; Sandra Godsey; Tom Rouse

(57) ABSTRACT

A method and apparatus for efficient encoding of linear block codes uses a lookup table including a set of impulse responses to support faster performance by encoding in parallel. Advantages include a scalability that is lacking in existing schemes.

34 Claims, 17 Drawing Sheets

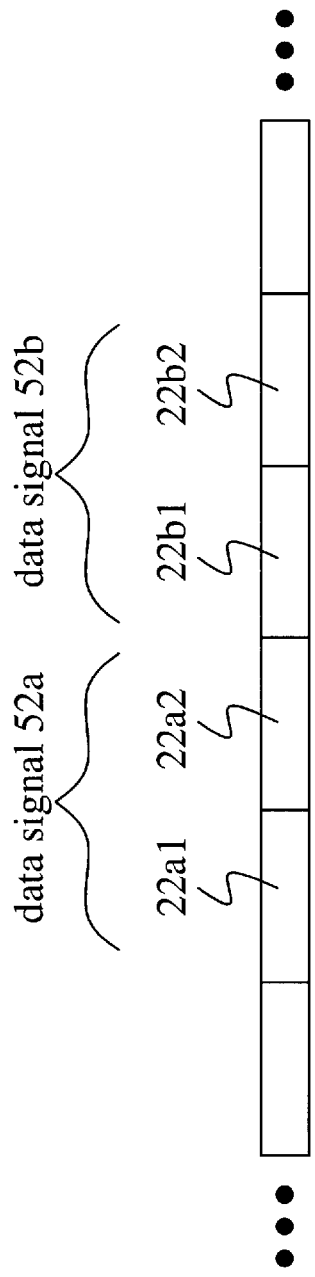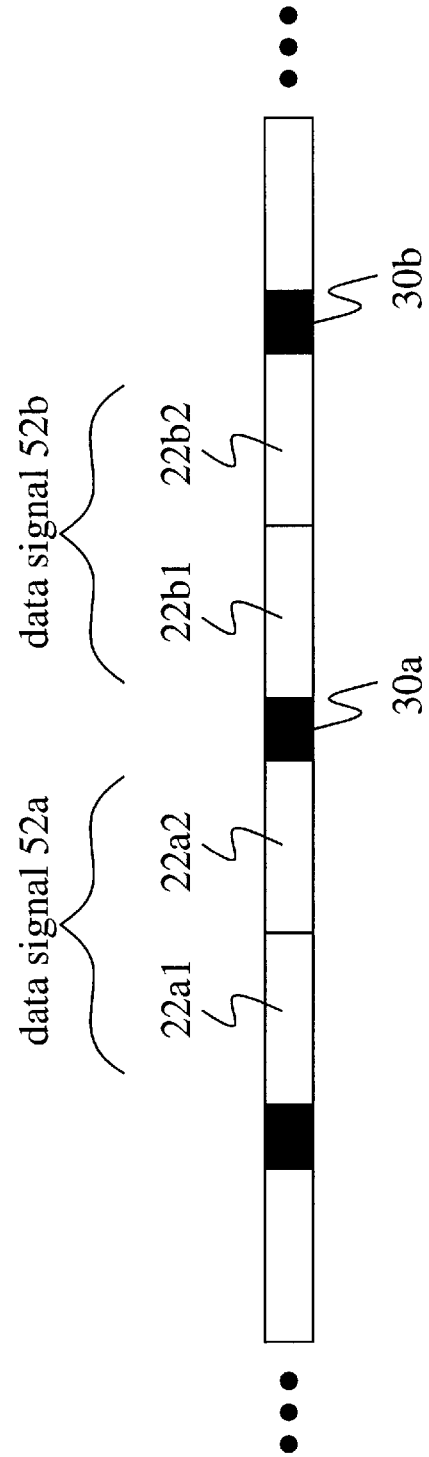

METHOD AND APPARATUS FOR ENCODING OF LINEAR BLOCK CODES

BACKGROUND OF THE INVENTION

1. Field of the Invention

The present invention relates to transfer (i.e. transmission and/or storage) of digital signals. More specifically, the present invention relates to encoding of linear block codes.

2. Description of the Related Art

Digital signals are commonly used in applications such as voice, data, and video communications and image, data and document storage, processing, and archiving. Unfortunately, because storage media and transmission channels are not perfect, they tend to introduce errors into the digital information passing through them. In a storage medium, for example, errors may arise because of defects which prevent some or all of the digital signal from being properly stored, retained, or retrieved. In a transmission channel, errors may arise because of interference from another signal or variations in channel quality due to a fading process, for example.

To increase data robustness, an error detection scheme may be employed wherein a check value is calculated from the digital signal and transferred along with it. (In one common practice, the digital signal is divided into blocks, and a check value is calculated from and appended to each block before transfer. In other schemes, the digital signal and the check value may be interleaved and/or may have some other relative arrangement in time.) When the signal is retrieved or received, the check value calculation is repeated. If the check values calculated before and after the transfer agree, then the transferred signal may be assumed error-free. If the check values do not agree, then the signal may be assumed to contain at least one error. When a linear block code is used in such a calculation, the resulting check value is called a checksum, and when a cyclic code is used in such a calculation, the resulting check value is called a cyclic redundancy checksum or CRC. Depending on the type of code used and the number and/or type of errors encountered, it may be possible to correct such errors without retransmission of the digital signal.

For an (n, k) cyclic code C, k information symbols are encoded into an n-symbol code word. For example, a (48, 32) cyclic code produces a 48-bit code word comprising the 32 original information symbols and a 16-bit CRC. A cyclic code of this type may be uniquely defined by a generator polynomial G(X) of degree n–k having the form $$G(X) = 1 + \left( \sum_{i=1}^{n-k-1} g_i X^i \right) + X^{n-k}.$$

A checksum calculated according to such a code has a length of n–k bits. An exemplary format for an (n, k) code is shown in FIG. 1.

Addition over the Galois field GF(2) reduces to a logical exclusive-OR (XOR) operation, while multiplication over this finite field reduces to a logical AND operation. For a cyclic code generated by a generator polynomial as described above and applied over GF(2), therefore, an encoder may be implemented using the logical circuit shown in FIG. 2. In this figure, the $g_i$ represent the coefficients of the generator polynomial G(X), each of the (n–k) storage elements holds one bit value, and the contents of the storage elements are updated in unison (i.e. values are shifted into the storage elements at every clock cycle). During the first k shifts, the switch pulls are in the upper positions to allow the information signal to be loaded into the encoder (and passed through to the output if desired). For the next (n–k) shifts, the switch pulls are moved to the lower positions to allow the state of the encoder (i.e. the string of bits corresponding to the ordered contents of the storage elements) to be clocked out as the checksum signal.

If the generator polynomial is known during the design of the encoder, the circuit of FIG. 2 may be simplified by omitting the i-th AND gate (for $g_i=0$) or replacing it with a connection (for $g_i=1$). For example, the code polynomial $$G(X) = X^{16} + X^{15} + X^{14} + X^{11} + X^6 + X^5 + X^2 + X + 1$$

(as specified in, e.g., sections 2.1.3.4.2.1 and 2.1.3.5.2.1 of part 2 of the IS-2000 standard published by the Telecommunications Industry Association, Arlington, Va.) may be implemented with the logical circuit shown in FIG. 3.

Although they have very low hardware requirements, using very little storage and only a few logic gates, serial encoder implementations as shown in FIGS. 2 and 3 process only one bit of the input signal per clock period. Such performance may be unacceptably slow, especially for applications that involve real-time data streams (for example, communications applications).

Encoders that operate on more than one bit per cycle have been implemented by using precalculated lookup tables. In these implementations, a remainder for the current cycle is used as an index for choosing a value from a lookup table, and the chosen value is used to calculate a remainder for the next cycle. Although such an encoder processes multiple bits per cycle, it requires a lookup table whose size is related exponentially to the length of the remainder. Therefore, such implementations scale poorly and may not be suitable for applications that require both high speed and low storage consumption.

SUMMARY

In an apparatus according to an embodiment of the invention, a logic matrix receives an information signal and impulse responses that correspond to portions of the information signal. The logic matrix outputs a checksum that is based on a summation of at least two of the impulse responses.

BRIEF DESCRIPTION OF THE DRAWINGS

FIG. 14A is a graphical depiction of a signal stream comprising instances of data signals.

FIG. 14B is a graphical depiction of an encoded signal stream.

DETAILED DESCRIPTION

Figure 4:
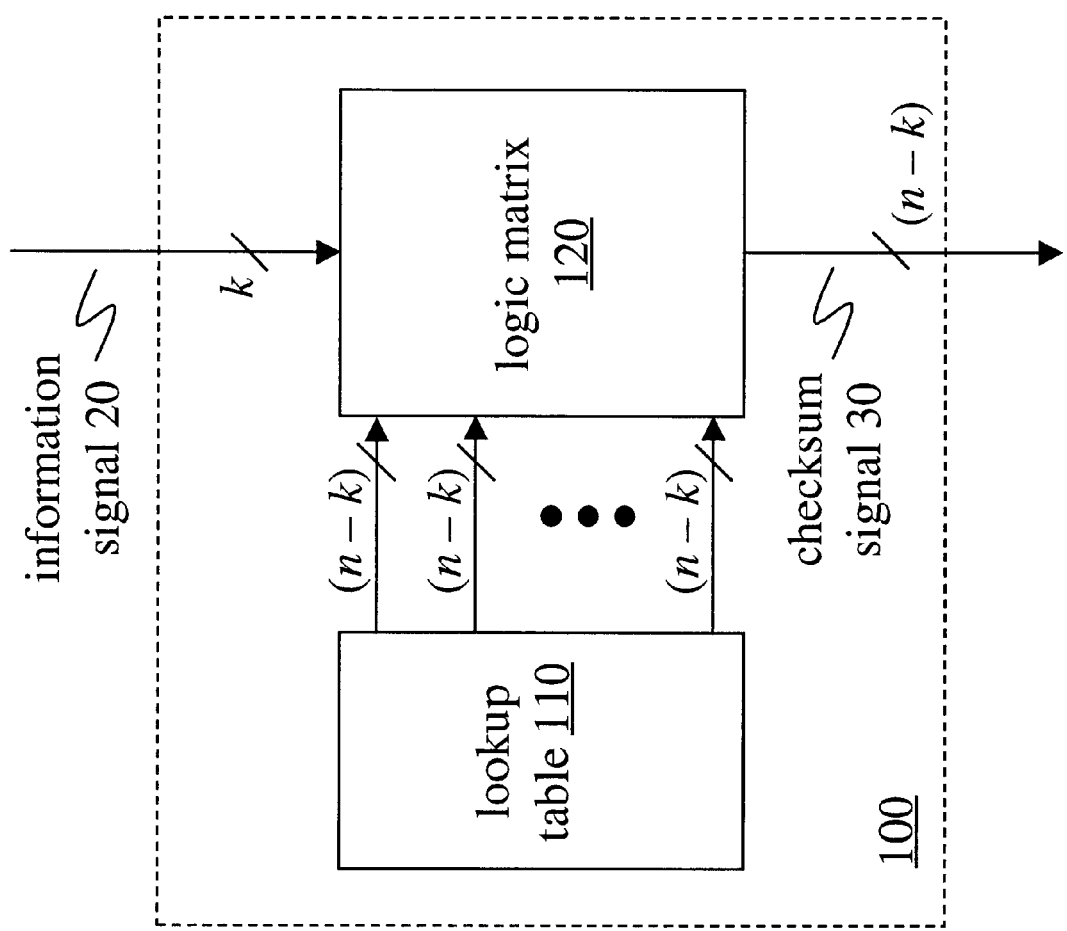
FIG. 4 is a block diagram for an apparatus according to an embodiment of the invention.

As shown in FIG. 4, an apparatus 100 according to an embodiment of the invention receives an information signal 20 of width k bits which is inputted to logic matrix 120. Lookup table 110 provides predetermined encoder response information to another set of inputs of logic matrix 120. Logic matrix 120 performs a predetermined logical function on its inputs to produce a checksum signal 30.

Figure 1:
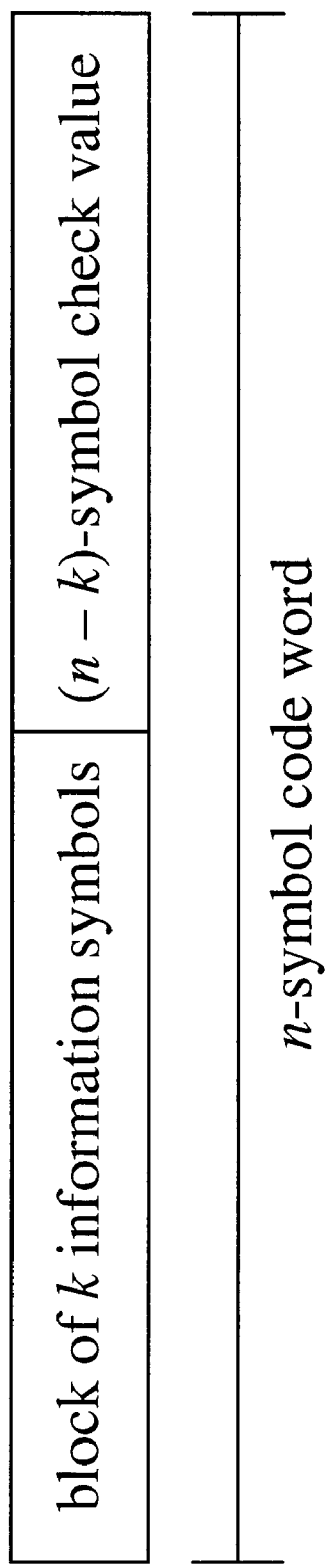
FIG. 1 is a diagram showing a format of a code word.
Figure 2:
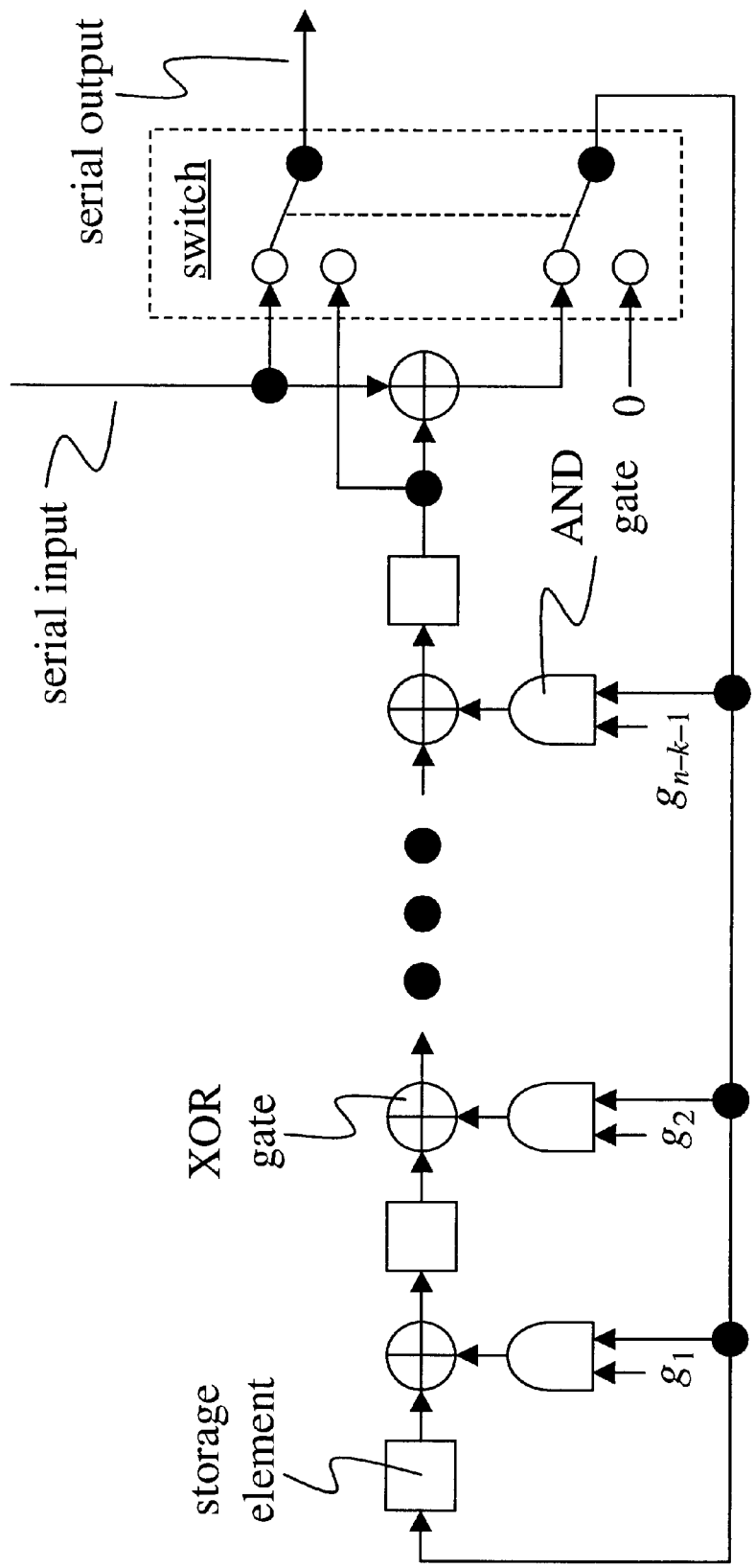
FIG. 2 is a logical diagram for a generic encoder for a cyclic code.
Figure 3:
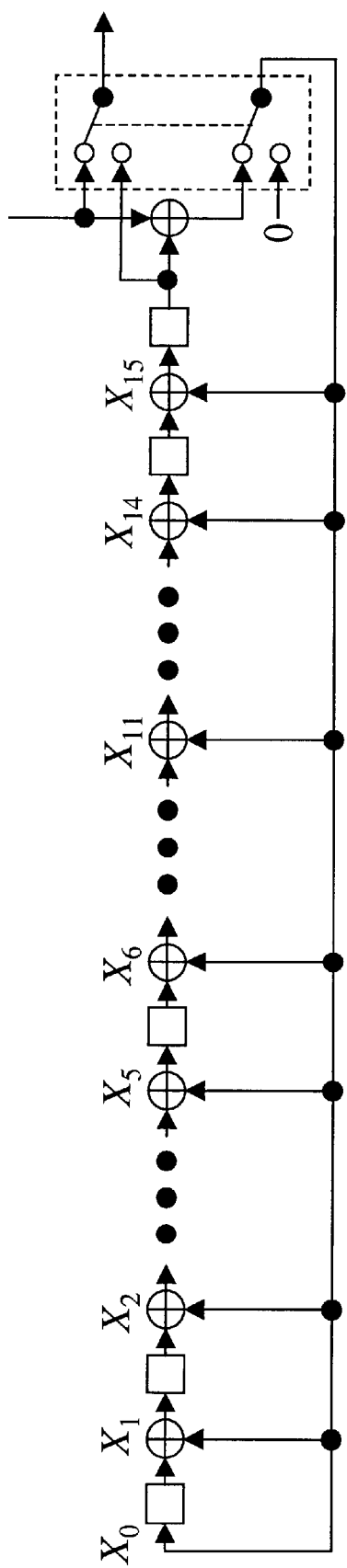
FIG. 3 is a logical diagram for an encoder for a particular cyclic code.

Lookup table 110 stores information relating to impulse responses of an encoder for a cyclic code generated by a particular generator polynomial G(X) (e.g. an encoder according to a specific implementation of the circuit of FIG. 2) and having a predetermined initial state. Specifically, lookup table 110 stores k impulse responses of such an encoder, where the j-th impulse response (j being an integer from 1 to k) is the state of the encoder that results from shifting in the j-th impulse input (i.e. the string of length k wherein only the j-th bit has a nonzero value). Exemplary methods of constructing lookup table 110 are discussed below.

Figure 5:
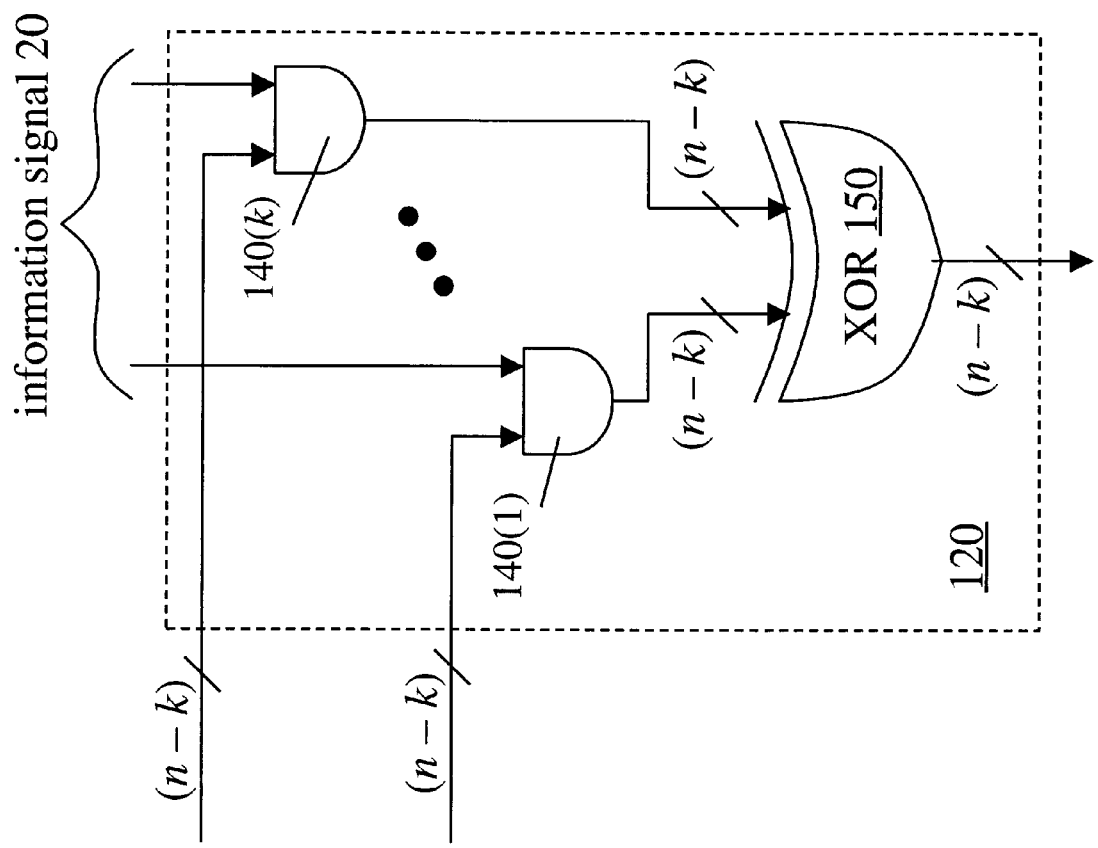
FIG. 5 is a circuit diagram for logic matrix 120.

Logic matrix 120 selects impulse responses from lookup table 110 that correspond to nonzero bits of information signal 20 and outputs the summation of these responses. FIG. 5 shows a block diagram for an exemplary implementation of logic matrix 120 that includes k AND gates 140 and one XOR gate 150. Each AND gate 140(m) (where m is an integer from 1 to k) has a one-bit-wide control input and a (n−k)-bit-wide data input. If the control input to gate 140(m) has a value of one, then the data input is passed to the output; otherwise, the gate's output is zero. For each gate 140(m) in matrix 120, the control input is the m-th bit of the information signal 20 and the data input is the m-th impulse response as obtained from lookup table 110. In an exemplary implementation, an AND gate 140(m) comprises several or many logical gates having more limited input capacities (e.g. two-input NAND gates) that are arranged to perform the logical function described above.

XOR gate 150 receives the k outputs of AND gates 140(m) and produces a (n−k)-bit-wide output. The p-th bit of the output of XOR gate 150 (where p is an integer from 1 to (n−k)) has (a) a value of one if an odd number of the p-th bits of the outputs of AND gates 140(m) have values of one and (b) a value of zero if an even number of the p-th bits of the outputs of AND gates 140(m) have values of one. In other words, the output of XOR gate 150 is a bitwise XOR of the inputs, the p-th bit of the output being the XOR of the p-th bits of the inputs.

Figure 6:
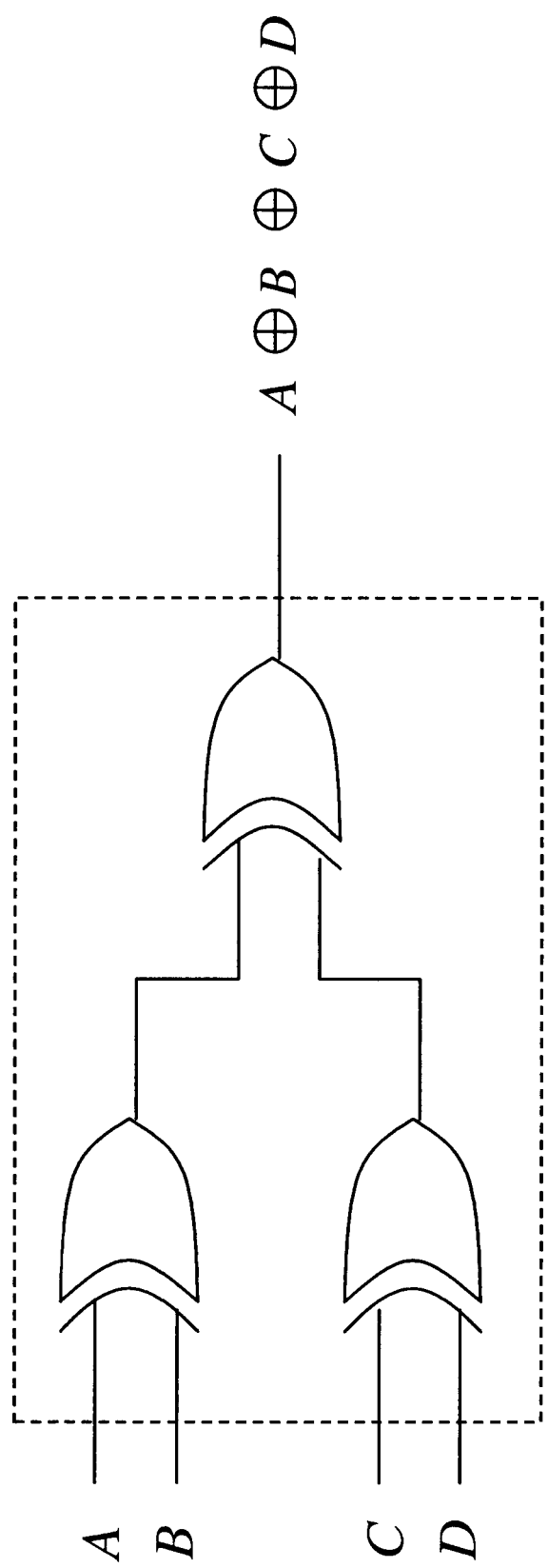
FIG. 6 shows an XOR gate constructed from a tree of XOR gates having smaller capacities.

XOR gate 150 may be implemented as a tree of XOR gates having smaller input capacities. For example, FIG. 6 shows how a four-input XOR gate may be constructed from a tree of three two-input XOR gates (each of which may be implemented from other logical gates). In an exemplary implementation, XOR gate 150 comprises several or many logical gates having more limited input capacities (e.g. two-input NAND gates) that are arranged to perform the logical function described above.

Note that in implementing the logical functions described above, the actual construction of logic matrix 120 may take many forms other than the particular one shown in FIG. 5. Because lookup table 110 is a constant for a fixed initial encoder state and fixed G(X), n, and k, for example, it may be knowable a priori that certain bits of the data inputs to AND gates 140(m) will be zero and that corresponding bits of the outputs of these gates, therefore, will also be zero. Because the operation of logic matrix 120 may be described using a logical expression, applying such a priori knowledge to eliminate terms from this expression that are known to be zero may be performed to reduce the expression and simplify the corresponding implementation (e.g. in logical gates). Such reduction may be performed manually or automatically. In one embodiment of an apparatus according to the invention, the configuration of logic matrix 120 for a specified G(X), n, and k and a specified initial encoder state is reduced to a more optimal form (e.g. a form that requires fewer logical gates to perform a logical operation equivalent to that of the structure shown in FIG. 5) by using an electronic design tool such as the Design Compiler produced by Synopsis, Inc. (Mountain View, Calif.).

Figure 7:
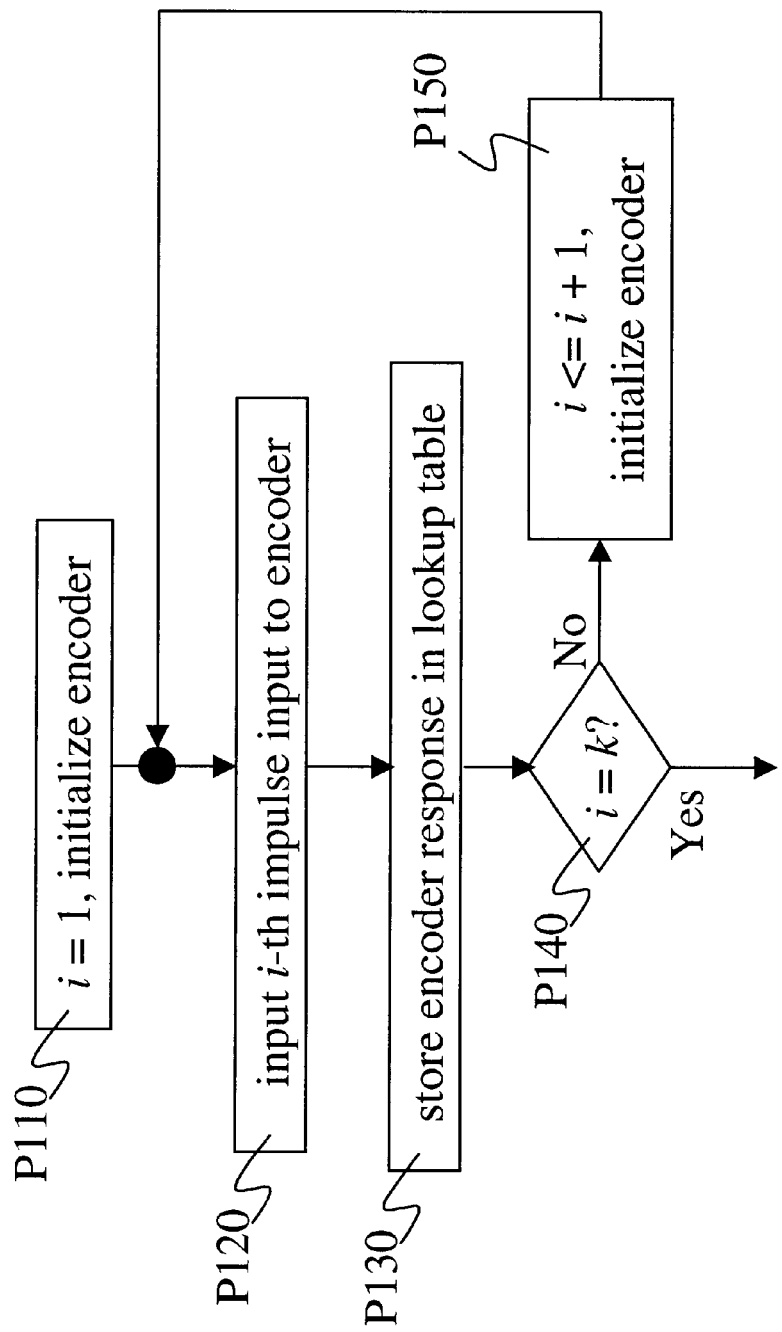
FIG. 7 shows a flow chart for a method for generating lookup table 110.

FIG. 7 shows a flowchart for an exemplary method of generating lookup table 110 by inputting a sequence of impulse inputs to an encoder for the cyclic code generated by the preselected polynomial G(X). In this method, the encoder may be implemented in hardware (e.g. according to a specific implementation of the circuit of FIG. 2). Note, however, that once the construction of lookup table 110 is completed, it is possible to practice the invention without further reference to such an encoder. Therefore, it may be desirable to implement at least a part of the encoder in software instead. Once the information to be stored in lookup table 110 is available, it is possible to practice the invention without reference to such an encoder either in hardware or in software (e.g. as seen in the apparatus of FIG. 4).

In subtask P110, a counter value i is set to 1. As the encoder's response depends upon its initial state, subtask P110 also includes initializing the encoder by storing a predetermined string of values into its storage elements. Note that if an encoder according to FIG. 2 is initialized to a zero state (i.e. an initial value of zero is stored into each of its storage elements), the encoder will not change its state when a string of values of zero is inputted. Because such strings are common leading sequences in some applications, it may be desirable to initialize the encoder with a string of values of one (or with some other nonzero string) instead.

In subtask P120, the i-th impulse input (i.e. the string of length k wherein only the i-th bit has a nonzero value) is inputted to the encoder (or simulation thereof). In subtask P130, the encoder's response to this input (i.e. the string of (n−k) bits that represents the state of the encoder after the impulse input has been loaded) is stored to a corresponding location in lookup table 110. Via the test of subtask P140 and the loop maintenance and initialization operations in subtask P150, subtasks P120 and P130 are repeated until an impulse response has been stored for all k possible impulse inputs.

Figure 8:
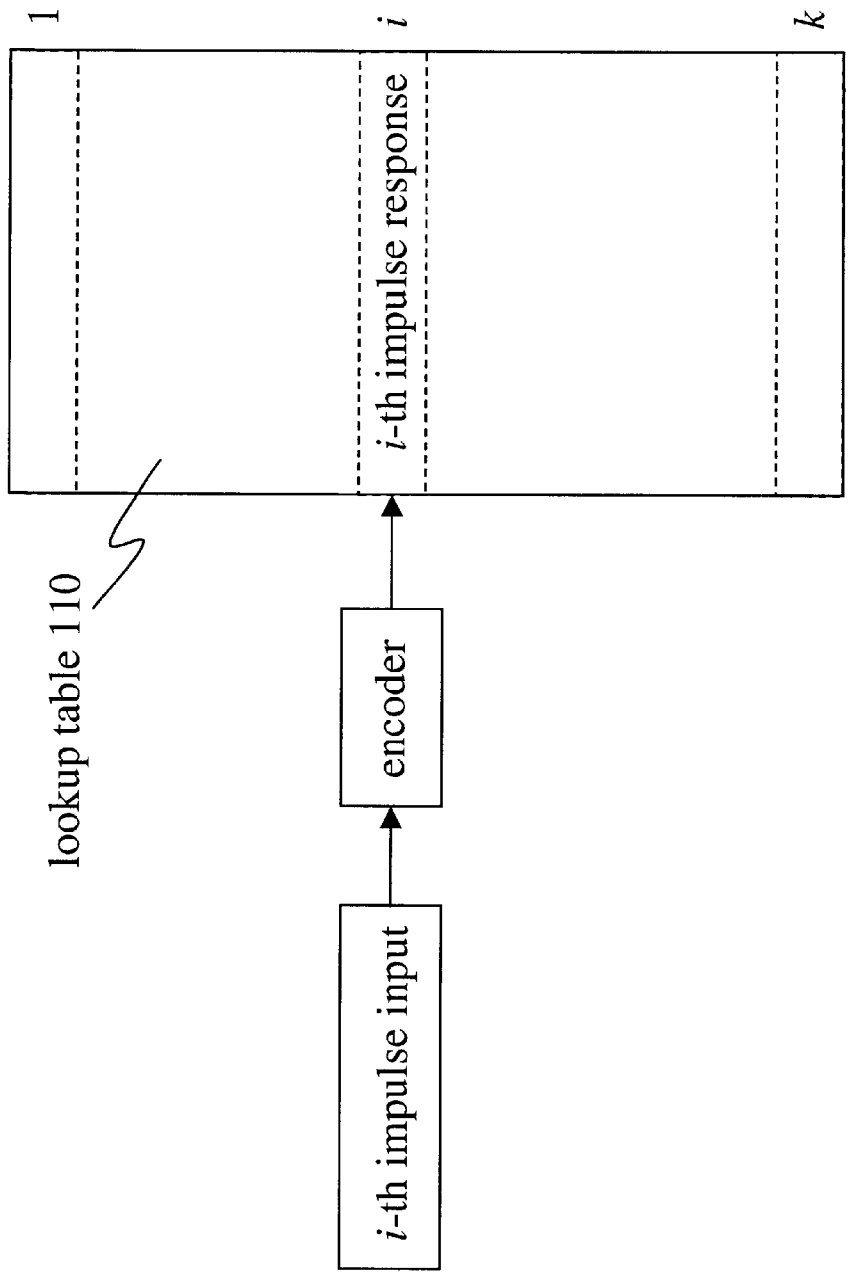
FIG. 8 depicts one iteration of subtasks P120 and P130 of the method of FIG. 7.

FIG. 8 is a graphical depiction of one iteration of subtasks P120 and P130. In this example, the encoder's response to the i-th impulse input is stored in the i-th row of the lookup table, although any other predetermined correspondence between input identifier and table location may be used. Besides the method shown in FIGS. 7 and 8, many other methods for generating a lookup table 110 suitable for use in apparatus 100 are possible.

A method and apparatus as herein described exhibit excellent scalability. For example, note that the size of lookup table 110 increases only linearly as n increases with k constant (or as k increases with (n−k) constant). In such case, the depth of a tree of XOR gates used to implement XOR gate 150 would be expected to grow as $\log_2(n)$.

Figure 9:
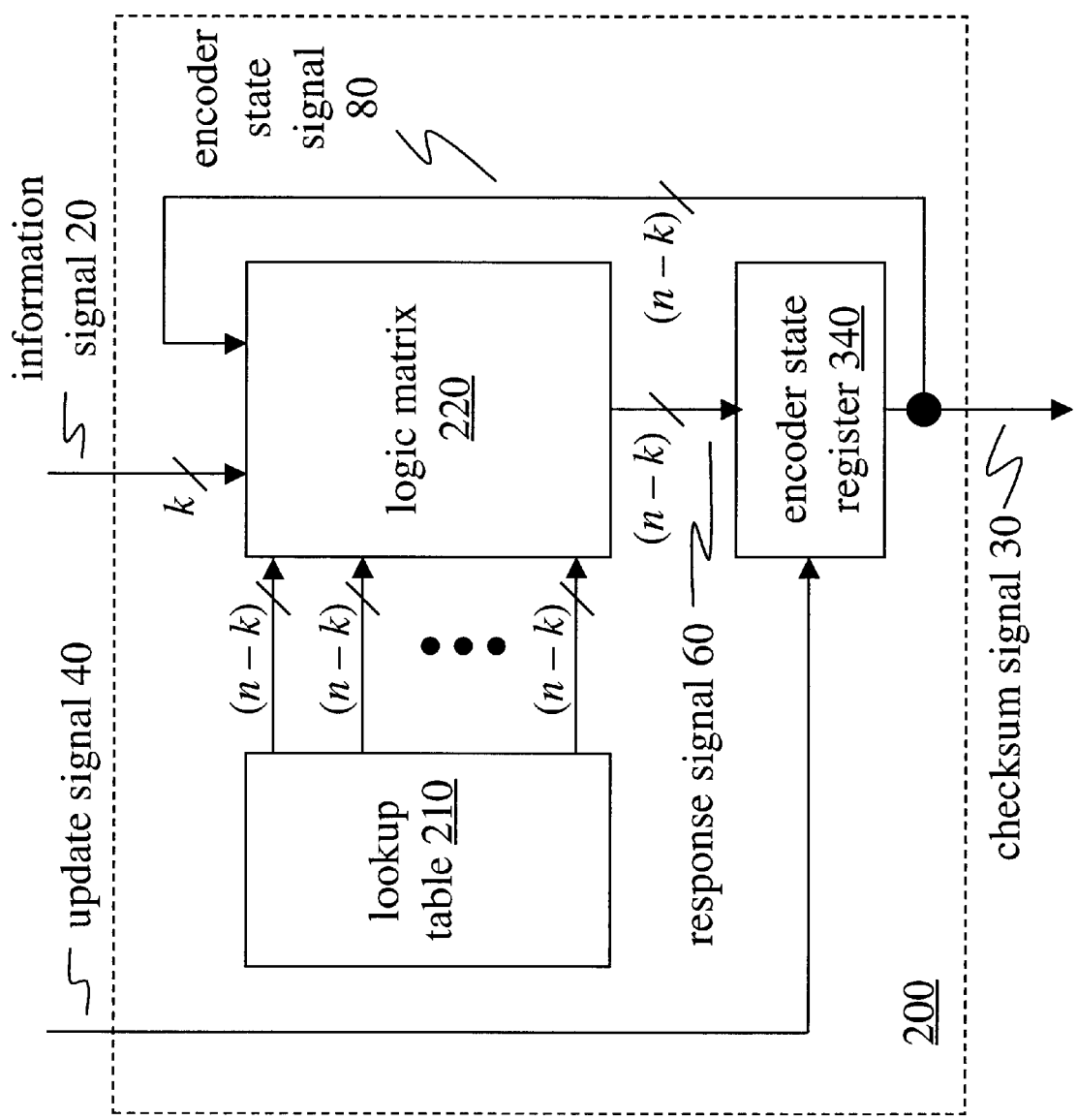
FIG. 9 is a block diagram for an apparatus according to another embodiment of the invention.

FIG. 9 shows a block diagram for an apparatus 200 according to another embodiment of the invention. In this apparatus, response signal 60 as outputted by logic matrix 220 may be stored into an encoder state register 340 for use as an initial encoder state in a subsequent encoding and/or outputted as checksum signal 30 as described below.

Figure 10:
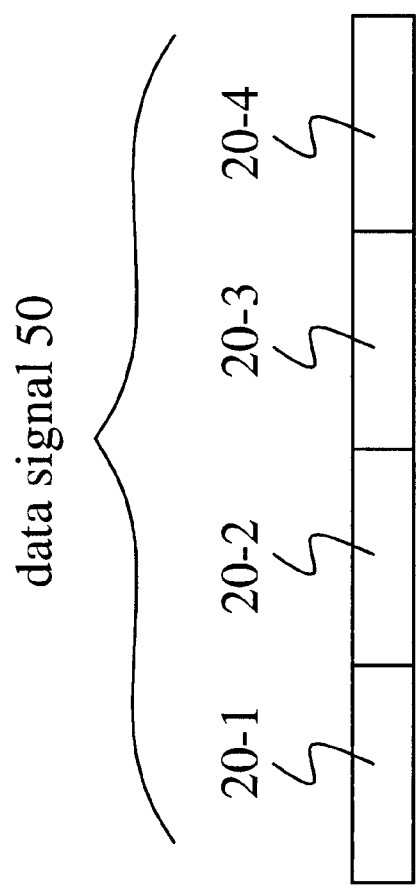
FIG. 10 is a graphical depiction of a data signal comprising instances of information signals.

In certain applications, it may be desired to use an (n, k) cyclic code to calculate a checksum of (n−k) bits from a data signal of more than k bits. In an exemplary application of apparatus 200, a data signal to be encoded is divided into adjacent and nonoverlapping strings (i.e. blocks) of k bits, which are successively inputted to apparatus 200 (in synchronism with update signal 40) as instances of information signal 20. FIG. 10 shows the example of a data signal 50 divided into four k-bit instances 20-1 through 20-4 of an information signal 20.

Lookup table 210 stores information relating to impulse responses of an encoder for a cyclic code generated by a particular generator polynomial G(X) (e.g. according to a specific implementation of the circuit of FIG. 2). Specifically, lookup table 210 stores k impulse responses of an encoder having a zero initial state (i.e. each storage element holds a value of zero). The j-th impulse response (where j is an integer from 1 to k) is the state of the encoder that results from shifting in the j-th impulse input, this input being the string of length k wherein only the j-th bit has a nonzero value.

In order to account for changes in the initial state of the encoder (e.g. from one instance of information signal 20 to the next), lookup table 210 also stores (n−k) zero responses of the encoder. Specifically, the q-th zero response (where q is an integer from 1 to (n−k)) is the state that results when a string of k zero-value bits is shifted into an encoder having the q-th component initial state, the q-th component initial state being the string of length (n−k) wherein only the q-th bit has a nonzero value.

Figure 11:
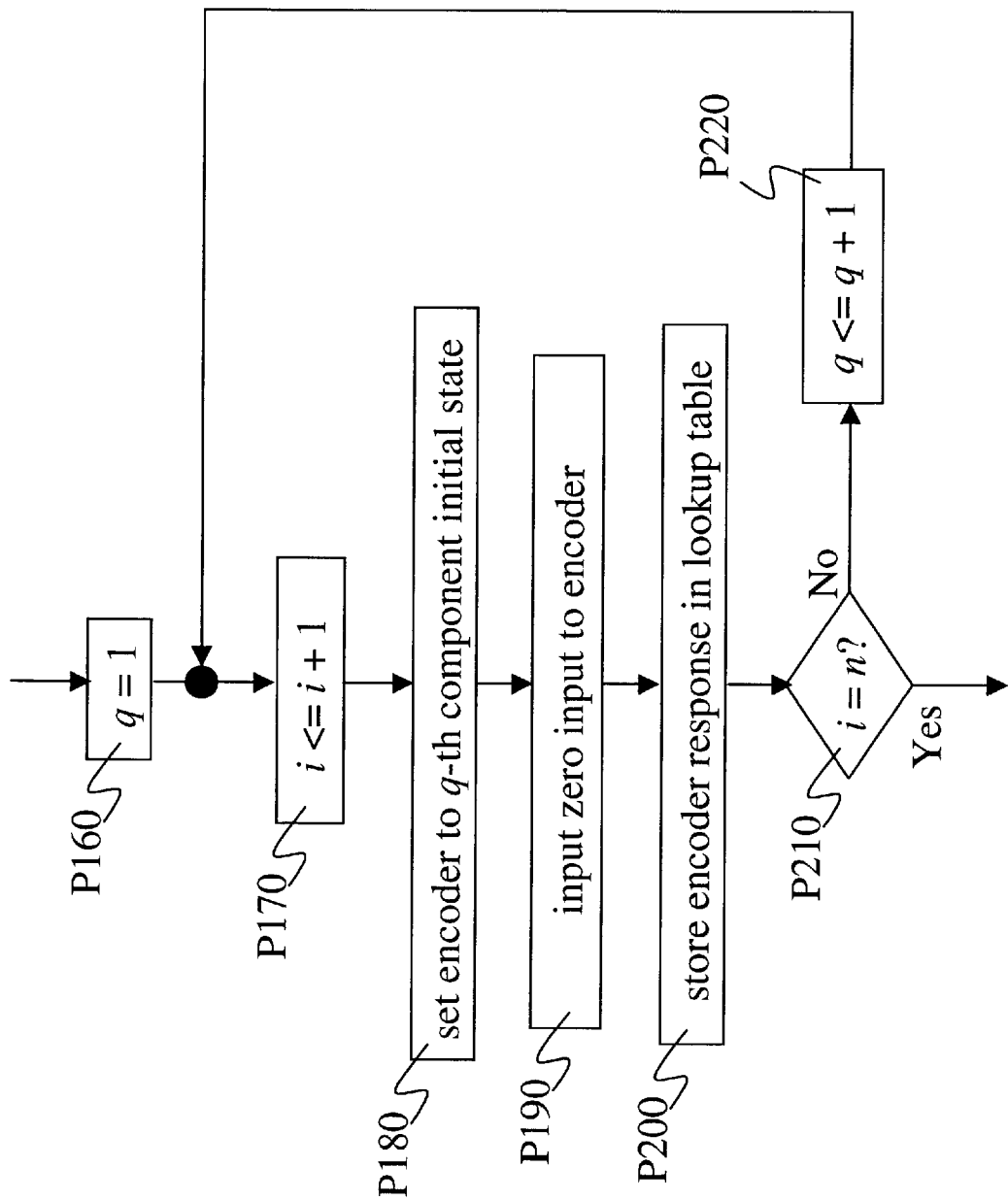
FIG. 11 shows a flow chart for a method for generating lookup table 210 that continues the flow chart shown in FIG. 7.

FIG. 11 shows a flowchart for an exemplary method of generating the zero-response portion of lookup table 210. This method comprises inputting a zero input to an encoder for the cyclic code generated by the preselected polynomial G(X) that has one of a set of predetermined initial states (note that this method includes the method shown in the flowchart of FIG. 7 and continues from task P140 in that flowchart). As above, the encoder may be implemented in hardware (e.g. according to a specific implementation of the circuit of FIG. 2), although once the construction of lookup table 210 is completed, it is possible to practice the invention without further reference to such an encoder. Therefore, it may be desirable to implement at least a part of the encoder in software instead. Once the information to be stored in lookup table 210 is available, it is possible to practice the invention without reference to such an encoder either in hardware or in software (e.g. as seen in the apparatus of FIG. 9).

In subtask P160, a counter value q is set to 1. In subtask P170, the counter value i is incremented (or, equivalently, set to the value (k+q)). In subtask P180, the encoder is initialized to the q-th component initial state by storing a string of (n−k) values into its storage elements, with the q-th value being one and all other values being zero.

In subtask P190, a zero input (i.e. a string of k zero bits) is inputted to the encoder (or simulation thereof). In subtask P200, the encoder's response to this input (i.e. the string of (n−k) bits that represents the state of the encoder after the zero input has been loaded) is stored to a corresponding location in lookup table 210. Via the test of subtask P210 and the loop maintenance operation in subtask P220, subtasks P170, P180, P190, and P200 are repeated until a zero response has been stored for all (n−k) possible component initial states.

Figure 12:
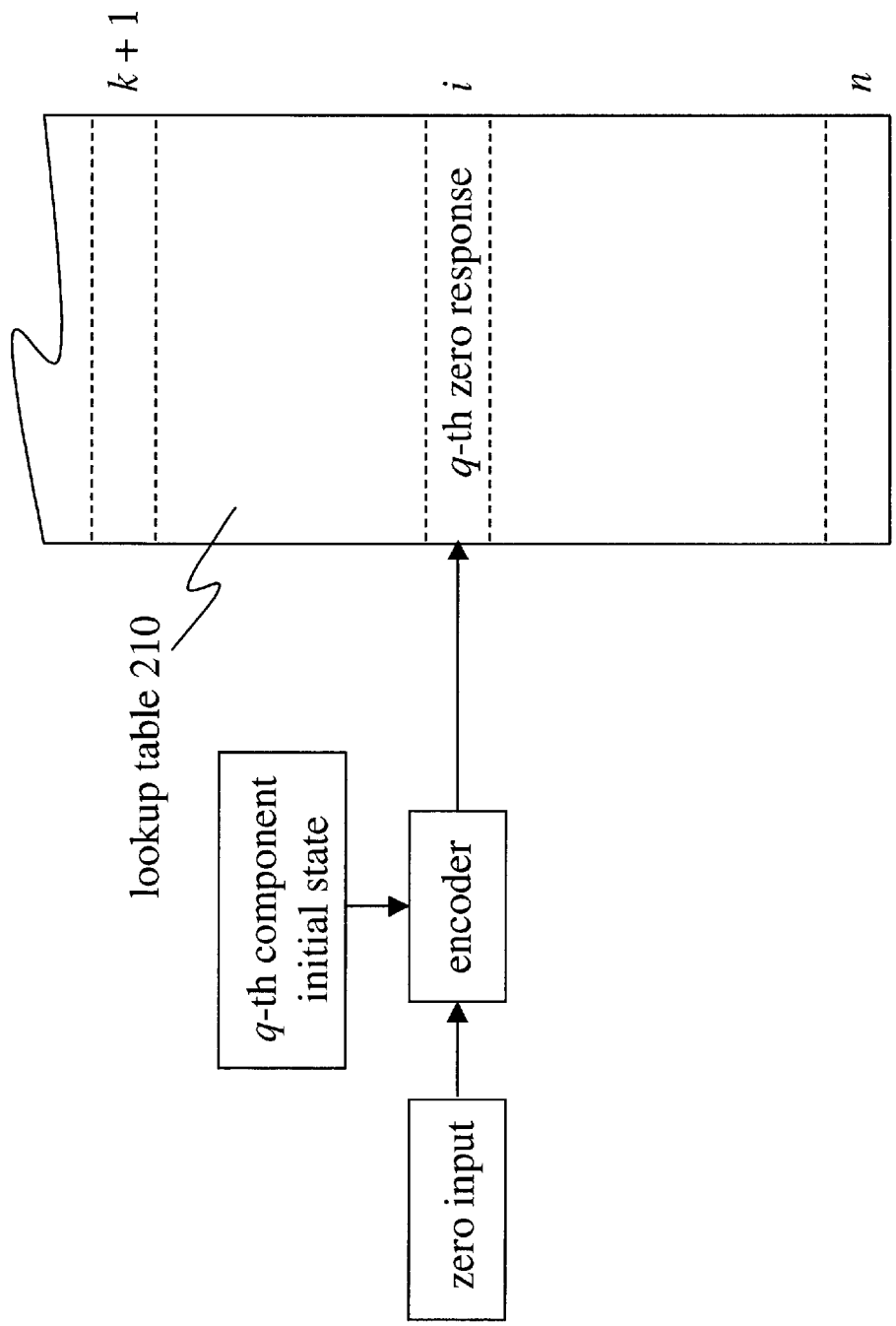
FIG. 12 depicts one iteration of subtasks P180, P190, and P200 of the method of FIG. 11.

FIG. 12 is a graphical depiction of one iteration of subtasks P180, P190, and P200. In this example, the first k rows of lookup table 210 are the same as the k rows of lookup table 110 as described above, and the zero response of an encoder having the q-th component initial state is stored in the i-th row of lookup table 210, although any other predetermined correspondence between input identifier and table location may be used. Besides the method shown in FIGS. 7, 8, 11, and 12, many other methods for generating sets of impulse responses and zero responses appropriate for use in lookup table 210 are possible.

Figure 13:
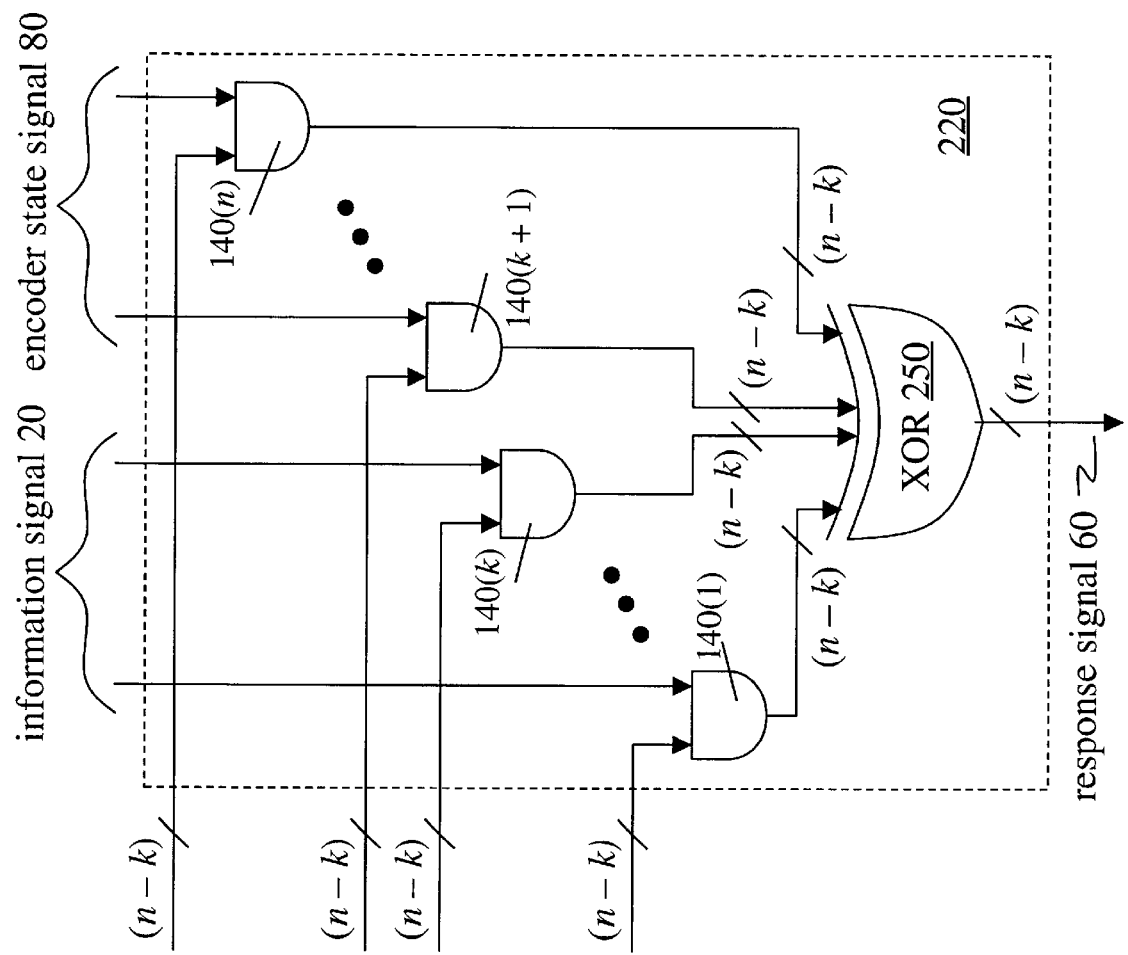
FIG. 13 is a circuit diagram for logic matrix 220.

FIG. 13 shows a block diagram for logic matrix 220, which includes n AND gates 140 and one XOR gate 250. As described above, each AND gate 140(r) (where r is an integer from 1 to n) has a one-bit-wide control input and a (n−k)-bit wide data input. If the control input to gate 140(r) has a value of one, then the data input is passed to the output; otherwise, the gate's output is zero.

For each gate 140(s) in matrix 220 (where s is an integer from 1 to k), the control input is the s-th bit of information signal 20 and the data input is the s-th impulse response, obtained from lookup table 210. For each gate 140(t) in matrix 220 (where t is an integer from (k+1) to n), the control input is the (t−k)-th bit of the encoder state signal 80 and the data input is the (t−k)-th zero response as obtained from lookup table 210.

XOR gate 250 receives the n outputs of AND gates 140(r) and produces a (n−k)-bit-wide output. The p-th bit of the output of XOR gate 150 (where p is an integer from 1 to (n−k)) has (a) a value of one if an odd number of the p-th bits of the outputs of AND gates 140(r) have values of one and (b) a value of zero if an even number of the p-th bits of the outputs of AND gates 140(r) have values of one. In other words, the output of XOR gate 250 is a bitwise XOR of the inputs, the p-th bit of the output being the XOR of the p-th bits of the inputs. The output of XOR gate 250 is stored into CRC register 340 in response to a specified transition (e.g. a rising edge and/or a trailing edge) of update signal 40.

As discussed above with respect to XOR gate 150, in an exemplary implementation XOR gate 250 may comprise several or many logical gates having more limited input capacities (e.g. two-input NAND gates) that are arranged to perform the logical function described above. Additionally, as with logic matrix 120, note that in implementing the logical functions described above, the actual construction of logic matrix 220 may take many forms other than the particular one shown in FIG. 10. Because lookup table 210 is a constant for fixed G(X), n, and k, for example, it may be knowable a priori that certain bits of the data inputs to AND gates 140(r) will be zero and that corresponding bits of the outputs of these gates, therefore, will also be zero. In one embodiment of an apparatus according to the invention, the configuration of logic matrix 220 is reduced to a more optimal form (e.g., a form that requires fewer logical gates to perform a logical operation equivalent to that shown in FIG. 13) by using an electronic design tool such as the Design Compiler produced by Synopsis, Inc. (Mountain View, Calif.).

Encoder state signal 80 represents the current state of encoder state register 340. In an exemplary implementation, encoder state register 340 is initialized to store the desired encoder initial state. At a time when the first instance 20-1 of information signal 20 is present at the appropriate input of logic matrix 220, encoder state register 340 presents this desired initial state to an appropriate input of logic matrix 220 via a first instance 80-0 of encoder state signal 80. After sufficient time has passed for the output of logic matrix 220 (i.e. response signal 60) to stabilize, a specified transition of update signal 40 causes encoder state register 340 to store that output and to forward it to logic matrix 220 as a second instance 80-1 of encoder state signal 80.

At a time when encoder state signal 80-1 is present at the appropriate input of logic matrix 220, the next instance 20-2 of information signal 20 is present at the corresponding appropriate input of logic matrix 220. After sufficient time has passed for response signal 60 to stabilize, a specified transition of update signal 40 causes encoder state register 340 to store that signal and to forward it to logic matrix 220 as a third instance 80-2 of encoder state signal 80. This process continues until the final instance 20-x of information signal 20, and instance 80-(x−1) of encoder state signal 80, are presented to the appropriate inputs of logic matrix 220. The output of logic matrix 220 (i.e. response signal 60) responsive to these inputs represents the desired checksum for the original data signal 50, and this signal is outputted as checksum signal 30.

For most applications, it will not be necessary for apparatus 200 to output any of the other instances of response signal 60 as checksum signal 30. In another implementation, therefore, a register and/or gate may be provided at the output of apparatus 200 (e.g. controlled by an appropriate timing signal that may be based on update signal 40) in order to prevent other instances of response signal 60 from appearing on checksum signal 30.

It may not be necessary for the total number of bits in data signal 50 to be a multiple of k. For example, data signal 50 may be padded by zeros to a length that is a multiple of k. Note, however, that in such case it may be necessary to perform a reverse cyclic shift on the final instance of checksum signal 30 (the number of shift positions corresponding to the number of padded zeros) in order to obtain a result equivalent to that which would be produced by shifting the unpadded data signal 50 into an encoder as shown, e.g., in FIG. 2.

FIG. 14A shows a signal stream wherein each data signal 52 of a signal stream comprises a number of instances of information signals 22 of width k. FIG. 14B shows one example of how this signal stream may be configured after encoding to include the checksum signals 30.

Figure 15:
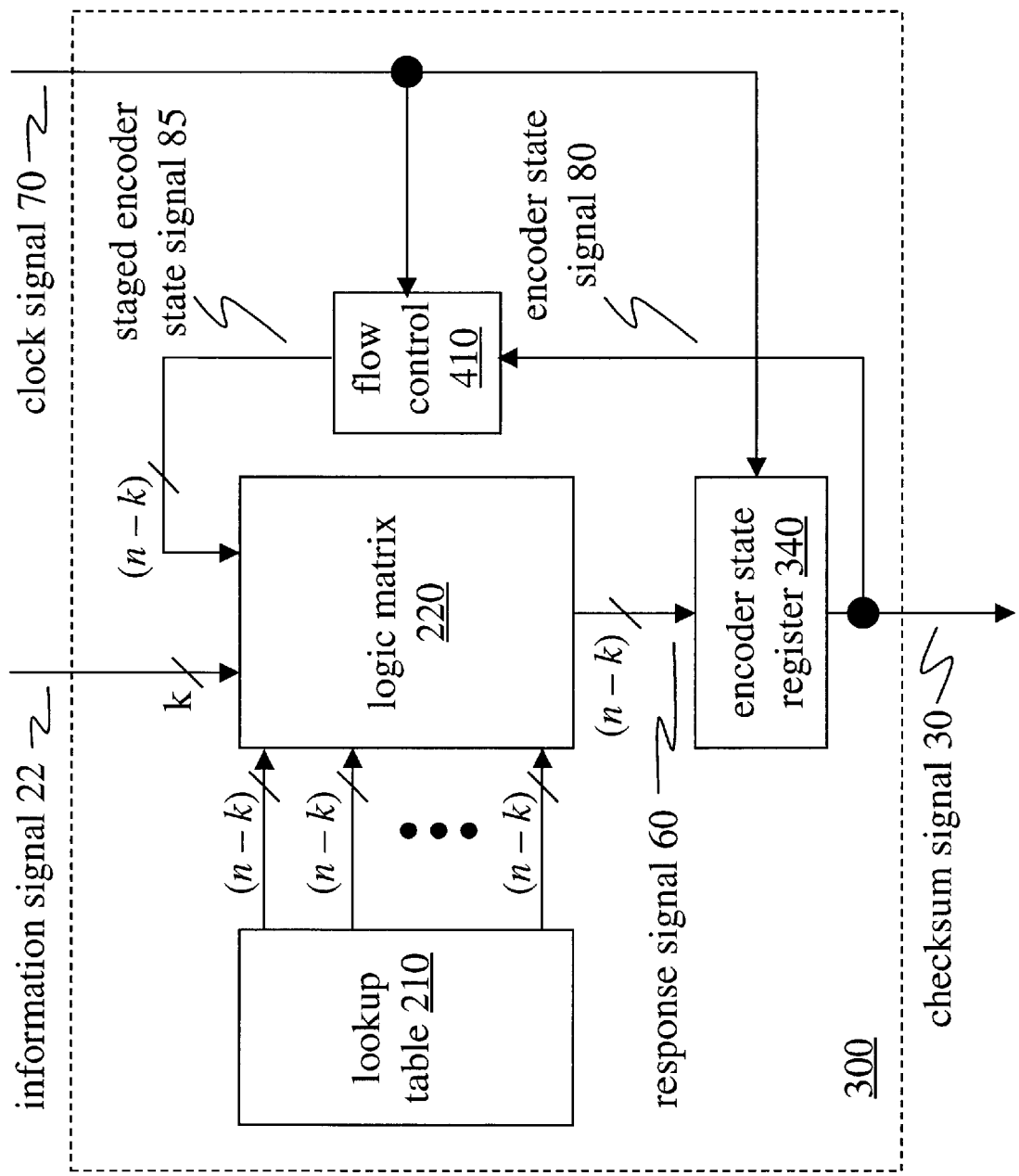
FIG. 15 is a block diagram for an apparatus according to a further embodiment of the invention.

FIG. 15 shows an apparatus according to a further embodiment of the invention. With respect to encoder state register 340, clock signal 70 performs a function in this apparatus analogous to that of update signal 40 in the apparatus of FIG. 9. It is desirable for the period of clock signal 70 to be at least as long as the maximum time required for logic matrix 220 to stabilize after new instances of information signal 22 and staged encoder state signal 85 are presented at its inputs.

We begin a description of an exemplary application of the apparatus shown in FIG. 15 with the arrival of information signal 22a1 at an input to logic matrix 220. Flow control 410 is configured (as described below, for example) such that staged encoder state signal 85 having the desired encoder initial state is present at an input to logic matrix 220 together with information signal 22a1. After sufficient time to allow the state of apparatus 300 to settle, the resulting output of logic matrix 220 (i.e. response signal 60) is clocked into encoder state register 340 (and onto encoder state signal 80) by an assertion of clock signal 70. Flow control 410 is configured to pass encoder state signal 80 (as staged encoder state signal 85) to an input of logic matrix 220.

Information signal 22a2 now arrives at an input to logic matrix 220. After sufficient settling time, response signal 60 is clocked into encoder state register 340 by another assertion of clock signal 70. The desired checksum 30a (i.e. corresponding to an encoding of data signal 50a with the cyclic code generated by G(X)) is now present at the output of encoder state register 340 and may be outputted by apparatus 300 as needed.

In a similar manner, information signal 22b1 arrives at an input to logic matrix 220, and flow control 410 is configured such that staged encoder state signal 85 presents the desired encoder initial state at another input to logic matrix 220. The resulting output of matrix 220 (i.e. response signal 60) is clocked into encoder state register 340 (and onto encoder state signal 80) by an assertion of clock signal 70. Flow control 410 is configured to pass encoder state signal 80 (as staged encoder state signal 85) to an input of logic matrix 220. Information signal 22b2 then arrives at an input to logic matrix 220. After sufficient settling time, clock signal 70 is asserted to clock response signal 60 into encoder state register 340 and thereby to the output of encoder state register 340 for output as the desired checksum 30b. In an exemplary application, the data signals and corresponding checksums are then assembled as shown in FIG. 14B.

Figure 16:
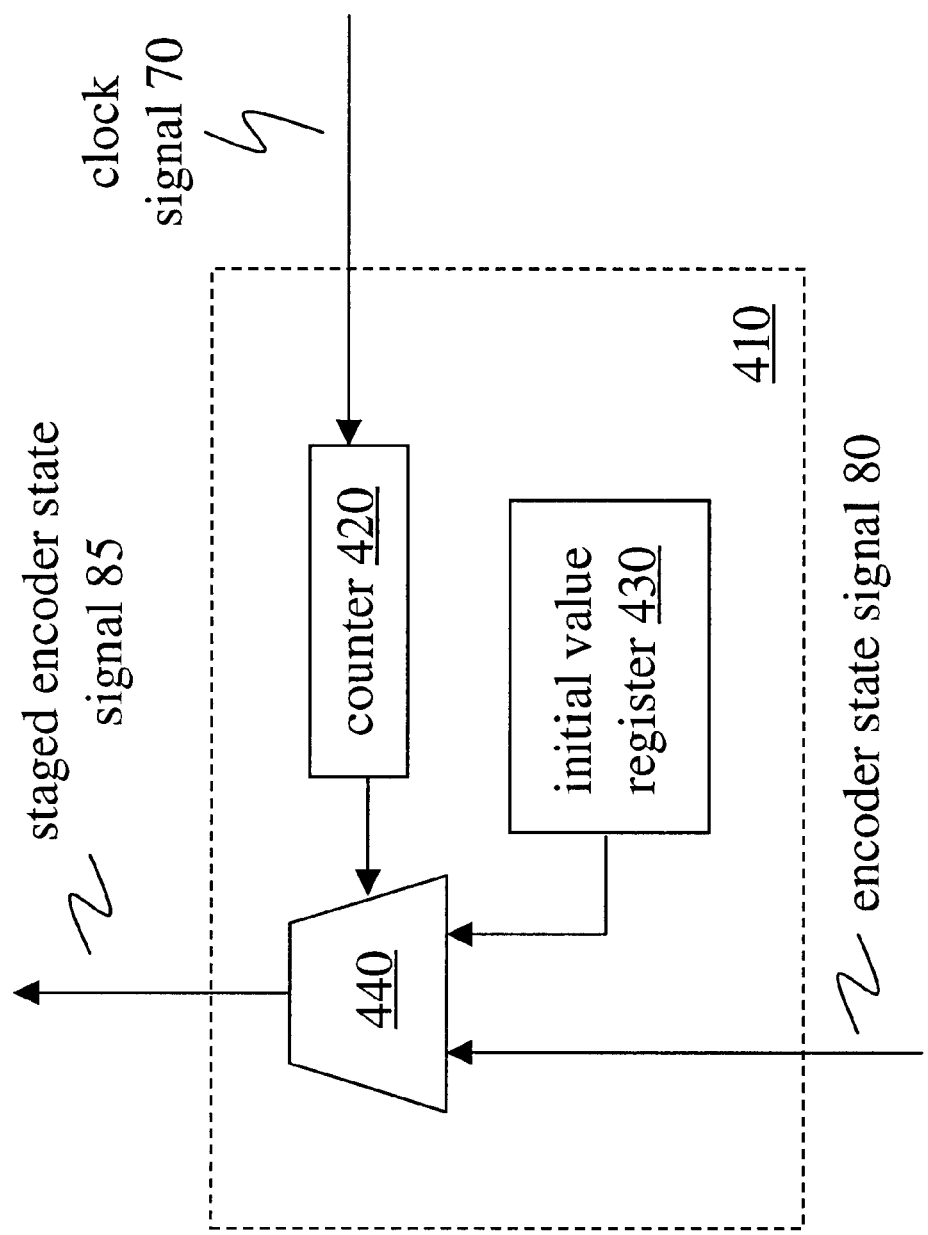
FIG. 16 is a block diagram for a flow control block.

Timed presentation of the initial encoder state to an input of logic matrix 220 is accomplished automatically via flow control block 410. As illustrated in FIG. 16, block 410 may include a multiplexer 440 which passes staged encoder state signal 85 to an input of logic matrix 220 (i.e. to the (n−k) input lines shown to receive encoder state signal 80 in FIG. 10). Depending on a signal received from counter 420, multiplexer 440 causes staged encoder state signal 85 to carry either encoder state signal 80 or the (n−k)-bit-wide initial encoder state (stored in initial value register 430).

Counter 420 operates according to a predetermined parameter z, where $$z = \left\lceil \frac{D}{k} \right\rceil$$

(i.e. the smallest integer not less than D/k) and D is the length of data signal 50 in bits. In the example of FIG. 16, z=2. The counting value of counter 420 is incremented at every cycle of clock signal 70 and is reset to zero every z clock cycles. When a counting value of counter 420 is zero, counter 420 causes multiplexer 440 to pass the initial encoder state from initial value register 430. Otherwise, counter 420 causes multiplexer 440 to pass encoder state signal 80. Many other arrangements for placing encoder state signal 80 and the initial encoder value onto staged encoder state signal 85 as appropriate are possible.

Figure 17:
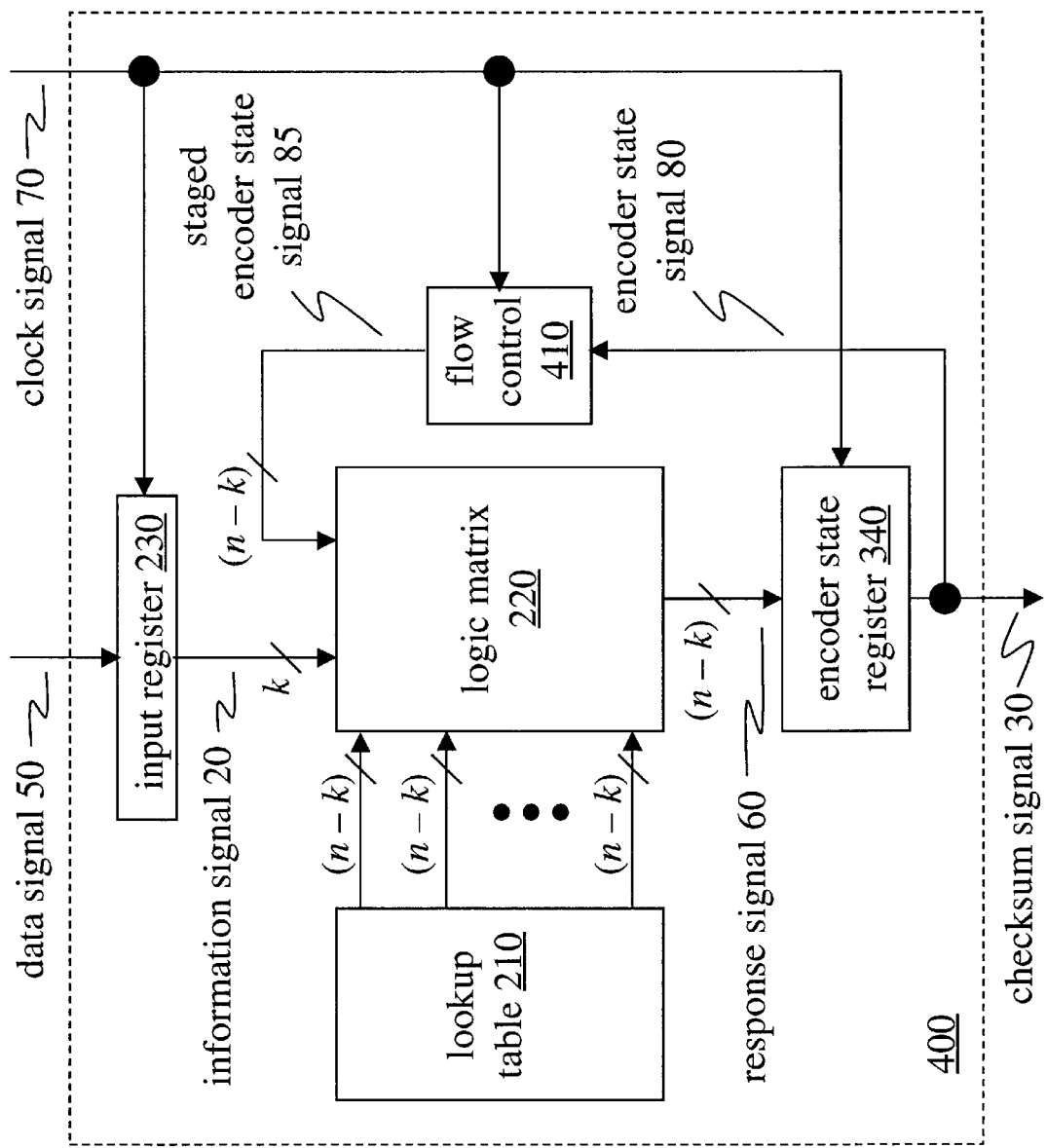
FIG. 17 is a block diagram for an apparatus according to a further embodiment of the invention.

As shown in FIG. 17, an apparatus 400 according to a further embodiment of the invention may include an input register 230, which receives data signal 52 and outputs k-bit-wide instances of information signal 22. Input register 230 may receive the individual values of data signal 52 in series and/or in parallel. It is desirable for data signal 52 to supply data to input register 230 at a sufficient rate to allow input register 230 to supply the next instance of information signal 22 at each cycle of clock signal 70. In an exemplary implementation, input register 230 may be constructed as a circular queue or 'ring buffer.' In another implementation, input register 230 may be constructed as a double buffer. In an implementation where read and write access to input register 230 may conflict, input register 230 may be implemented using a dual-port storage element.

The foregoing presentation of the described embodiments is provided to enable any person skilled in the art to make or use the present invention. Various modifications to these embodiments are possible, and the generic principles presented herein may be applied to other embodiments as well. For example, the invention may be implemented in part or in whole as a hard-wired circuit, as a circuit configuration fabricated into an application-specific integrated circuit, or as a firmware program loaded into non-volatile storage or a software program loaded from or into a data storage medium as machine-readable code, such code being instructions executable by an array of logic elements such as a microprocessor, microcontroller, or other digital signal processing unit. Thus, the present invention is not intended to be limited to the embodiments shown above but rather is to be accorded the widest scope consistent with the principles and novel features disclosed in any fashion herein.

What is claimed is:

1. A method comprising:
   receiving an information signal, said information signal comprising a string of k bits that includes p bits having nonzero values, k and p being integers;
   receiving p impulse responses, each among said p impulse responses corresponding to one among said p bits; and
   obtaining a checksum, said checksum comprising a summation of said p impulse responses.

2. The method according to claim 1, wherein each among said p impulse responses represents a response of an encoder for a linear block code to a string of k bits, said string including (k−1) zero bits and a nonzero bit at a p-th position.

3. The method according to claim 2, wherein said checksum comprises a string of (n−k) bits, n being an integer, and wherein the linear block code is characterized by a generator polynomial of the form $$G(X) = 1 + \left( \sum_{i=1}^{n-k-1} g_i X^i \right) + X^{n-k}.$$

4. The method according to claim 1, wherein said checksum comprises a summation modulo 2 of said p impulse responses.

5. A method comprising:
   receiving an information signal, said information signal comprising a string of k bits that includes p bits having nonzero values, k and p being integers;
   receiving p impulse responses, each among said p impulse responses corresponding to one among said p bits;
   receiving an encoder state signal, said encoder state signal comprising a string of (n−k) bits that includes r bits having nonzero values, n and r being integers;
   receiving r zero responses, each among said r zero responses corresponding to one among said r bits; and
   obtaining a checksum, said checksum being a summation of said p impulse responses and said r zero responses.

6. The method according to claim 5, wherein each among said p impulse responses represents a response of an encoder for a linear block code to a string of k bits, said string including (k−1) zero bits and a nonzero bit at a p-th position.

7. The method according to claim 6, wherein the linear block code is characterized by a generator polynomial of the form $$G(X) = 1 + \left( \sum_{i=1}^{n-k-1} g_i X^i \right) + X^{n-k}.$$

8. The method according to claim 5, wherein said checksum comprises a summation modulo 2 of said p impulse responses and said r zero responses.

9. The method according to claim 5, wherein each among said r zero responses represents a response of an encoder for a linear block code having an r-th component initial state to a string of k zero bits,
   wherein said r-th component initial state is a string of length (n−k) including (n−k−1) zero bits and a nonzero bit at an r-th position.

10. The method according to claim 9, wherein the linear block code is characterized by a generator polynomial of the form $$G(X) = 1 + \left( \sum_{i=1}^{n-k-1} g_i X^i \right) + X^{n-k}.$$

11. A method comprising:
    receiving a signal for encoding;
    receiving a plurality of impulse responses;
    receiving a plurality of zero responses; and
    obtaining a checksum,
    wherein said checksum comprises a summation of at least two responses, and
    wherein each among said at least two responses is a member of one among said plurality of impulse responses and said plurality of zero responses, and
    wherein each among said at least two responses corresponds to a predetermined position within said signal for encoding.

12. A method according to claim 11, wherein each among said at least two responses corresponds to a position within said signal for encoding that is occupied by a bit having a nonzero value.

13. The method according to claim 11, wherein said checksum comprises a summation modulo 2.

14. A method comprising:
    receiving a first information signal, said first information signal comprising a string of k bits that includes p bits having nonzero values, k and p being integers;
    receiving p impulse responses, each among said p impulse responses corresponding to one among said p bits;
    receiving a first encoder state signal, said first encoder state signal comprising a string of (n−k) bits that includes r bits having nonzero values, n and r being integers;
    receiving r zero responses, each among said r zero responses corresponding to one among said r bits;
    obtaining a second encoder state signal, said second encoder state signal comprising a summation of said p impulse responses and said r zero responses;

receiving a second information signal, said second information signal comprising a string of k bits; and obtaining a checksum, said checksum being based at least in part on said second encoder state signal and said second information signal.

15. The method according to claim 14, wherein each among said p impulse responses represents a response of an encoder for a linear block code to a string of k bits, said string including (k−1) zero bits and a nonzero bit at a p-th position.

16. The method according to claim 15, wherein the linear block code is characterized by a generator polynomial of the form $$G(X) = 1 + \left(\sum_{i=1}^{n-k-1} g_i X^i\right) + X^{n-k}.$$

17. The method according to claim 14, wherein each among said r zero responses represents a response of an encoder for a linear block code having an r-th component initial state to a string of k zero bits, wherein said r-th component initial state is a string of length (n−k) including (n−k−1) zero bits and a nonzero bit at an r-th position.

18. The method according to claim 17, wherein the linear block code is characterized by a generator polynomial of the form $$G(X) = 1 + \left(\sum_{i=1}^{n-k-1} g_i X^i\right) + X^{n-k}.$$

19. A method comprising:

receiving a first information signal, said first information signal comprising a string of k bits that includes p bits having nonzero values, k and p being integers;

receiving p impulse responses, each among said p impulse responses corresponding to one among said p bits;

receiving a first encoder state signal, said first encoder state signal comprising a string of (n−k) bits that includes r bits having nonzero values, n and r being integers;

receiving r zero responses, each among said r zero responses corresponding to one among said r bits;

obtaining a second encoder state signal, said second encoder state signal being a summation of said p impulse responses and said r zero responses and comprising a string of (n−k) bits that includes s bits having nonzero values;

receiving a second information signal, said second information signal comprising a string of k bits that includes q bits having nonzero values;

receiving q impulse responses, each among said q impulse responses corresponding to one among said q bits;

receiving s zero responses, each among said s zero responses corresponding to one among said s bits; and obtaining a checksum, said checksum being a summation of said q impulse responses and said s zero responses.

20. The method according to claim 19, wherein each among said p impulse responses represents a response of an encoder for a linear block code to a string of k bits, said string including (k−1) zero bits and a nonzero bit at a p-th position.

21. The method according to claim 20, wherein the linear block code is characterized by a generator polynomial of the form $$G(X) = 1 + \left(\sum_{i=1}^{n-k-1} g_i X^i\right) + X^{n-k}.$$

22. The method according to claim 19, wherein said checksum comprises a summation modulo 2 of said q impulse responses and said s zero responses.

23. The method according to claim 19, wherein each among said r zero responses represents a response of an encoder for a linear block code having an r-th component initial state to a string of k zero bits, wherein said r-th component initial state is a string of length (n−k) including (n−k−1) zero bits and a nonzero bit at an r-th position.

24. The method according to claim 23, wherein the linear block code is characterized by a generator polynomial of the form $$G(X) = 1 + \left(\sum_{i=1}^{n-k-1} g_i X^i\right) + X^{n-k}.$$

25. A method comprising:

receiving an information signal, said information signal comprising a string of k bits that includes p bits having nonzero values, k and p being integers;

receiving k impulse responses, each among said k impulse responses corresponding to one among said k bits; and obtaining a checksum, said checksum comprising a summation of p among said k impulse responses.

26. The method according to claim 25, wherein each among said k impulse responses represents a response of an encoder for a linear block code to a string of k bits, said string including (k−1) zero bits and a nonzero bit.

27. The method according to claim 26, wherein the linear block code is characterized by a generator polynomial of the form $$G(X) = 1 + \left(\sum_{i=1}^{n-k-1} g_i X^i\right) + X^{n-k}.$$

28. The method according to claim 25, wherein said checksum comprises a summation modulo 2 of said p impulse responses.

29. An apparatus comprising:

a logic matrix configured and arranged to receive an information signal and to output a checksum; and a lookup table configured and arranged to store a plurality of responses of an encoder for a linear block code, wherein each among said plurality of responses comprises a response of the encoder to a predetermined input string, and wherein said checksum comprises a summation of at least two among said plurality of responses, and wherein said at least two among said plurality of responses are selected at least in part on the basis of at least a portion of said information signal.

30. The apparatus according to claim 29, wherein said information signal comprises a string of k bits, k being an integer, and wherein said plurality of responses includes k impulse responses, each among said k impulse responses corresponding to a position within said information signal.

31. The apparatus according to claim 30, wherein each among said k impulse responses comprises a response of the encoder having a zero initial state to a string of k bits, wherein said string of k bits includes a bit of nonzero value at a position corresponding to the position within said information signal and (k−1) bits of zero value.

32. The apparatus according to claim 29, wherein said logic matrix is further configured and arranged to receive an encoder state signal, and wherein said at least two among said plurality of responses are selected at least in part on the basis of at least a portion of said encoder state signal.

33. The apparatus according to claim 32, wherein said encoder state signal comprises a string of (n−k) bits, n being an integer, and wherein said plurality of responses includes (n−k) zero responses, each among said (n−k) zero responses corresponding to a position within said encoder state signal.

34. The apparatus according to claim 33, wherein each among said (n−k) zero responses comprises a response of the encoder having a component initial state to a string of k bits having zero values, wherein said component initial state is a string of bits including a bit having a nonzero value at a position corresponding to the position within said encoder state signal and (k−1) bits having zero values.

\* \* \* \* \*